US011862266B2

(12) United States Patent
Zhou

(10) Patent No.: US 11,862,266 B2
(45) Date of Patent: Jan. 2, 2024

(54) CHIP DETECTION METHOD AND CHIP DETECTION APPARATUS

(71) Applicant: CHANGXIN MEMORY TECHNOLOGIES, INC., Hefei (CN)

(72) Inventor: Jianbo Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 191 days.

(21) Appl. No.: 17/603,493

(22) PCT Filed: Jul. 29, 2021

(86) PCT No.: PCT/CN2021/109267
§ 371 (c)(1),
(2) Date: Oct. 13, 2021

(87) PCT Pub. No.: WO2022/198870
PCT Pub. Date: Sep. 29, 2022

(65) Prior Publication Data
US 2023/0056149 A1 Feb. 23, 2023

(30) Foreign Application Priority Data
Mar. 25, 2021 (CN) .......................... 202110318148.X

(51) Int. Cl.
*G01R 31/311* (2006.01)
*G11C 29/02* (2006.01)
*G11C 11/4074* (2006.01)

(52) U.S. Cl.
CPC .......... *G11C 29/021* (2013.01); *G01R 31/311* (2013.01); *G11C 11/4074* (2013.01)

(58) Field of Classification Search
CPC .. G01R 31/311; G01R 31/2851; G11C 29/02; G11C 29/021; G11C 11/4074
(Continued)

(56) References Cited

U.S. PATENT DOCUMENTS 5,504,431 A * 4/1996 Maeda ................ G01R 31/311
324/501
2004/0212380 A1* 10/2004 Koyama ............. G01R 31/311
324/754.03
(Continued)

FOREIGN PATENT DOCUMENTS

CN 102129026 A 7/2011
CN 103197224 A 7/2013
(Continued)

OTHER PUBLICATIONS

English translation of Jin et al. CN 107888810 A (Year: 2018).*
International Search Report cited in PCT/CN2021/109267, dated Nov. 24, 2021, 9 pages.

*Primary Examiner* — Jermele M Hollington
*Assistant Examiner* — Courtney G McDonnough
(74) *Attorney, Agent, or Firm* — Cooper Legal Group, LLC

(57) ABSTRACT

The present disclosure provides a chip detection method and a chip detection apparatus. The chip detection method includes: providing a chip to be tested, the chip including a power pump region, and the power pump region including a plurality of power pump structures; detecting a dim light signal emitted from the power pump region when the chip is in a preset working mode; and determining whether the dim light signal matches a corresponding power pump working mode in the preset working mode, and if not, confirming that the power pump region has a defect, the power pump working mode including a working state of the power pump structures in the power pump region.

15 Claims, 3 Drawing Sheets

(58) Field of Classification Search
USPC .................................................. 324/754.23
See application file for complete search history.

(56) References Cited

U.S. PATENT DOCUMENTS

| | | | |
|---|---|---|---|
| 2006/0179378 A1* | 8/2006 | Iida | G11C 5/147 |
| | | | 714/733 |
| 2013/0027051 A1 | 1/2013 | Ouyang et al. | |
| 2020/0176339 A1 | 6/2020 | Suyama et al. | |

FOREIGN PATENT DOCUMENTS

| | | | | |
|---|---|---|---|---|
| CN | 103389307 A | | 11/2013 | |
| CN | 107888810 A | * | 4/2018 | ............... G01J 3/46 |
| CN | 110892517 A | | 3/2020 | |
| CN | 113075533 A | | 7/2021 | |

* cited by examiner

CHIP DETECTION METHOD AND CHIP DETECTION APPARATUS

CROSS-REFERENCE TO RELATED APPLICATIONS

The present disclosure is a national stage entry of International Application No. PCT/CN2021/109267, filed on Jul. 29, 2021, which claims the priority to Chinese Patent Application 202110318148.X, titled "CHIP DETECTION METHOD AND CHIP DETECTION APPARATUS", filed on Mar. 25, 2021. The entire contents of International Application No. PCT/CN2021/109267 and Chinese Patent Application 202110318148.X are incorporated herein by reference.

TECHNICAL FIELD

The present disclosure relates to, but is not limited to, a chip detection method and a chip detection apparatus.

BACKGROUND

Dynamic Random Access Memory (DRAM) is a semiconductor structure commonly used in electronic equipment such as computers. The DRAM is composed of a plurality of memory cells, and each memory cell usually includes a transistor and a capacitor. A gate of the transistor is electrically connected to a word line, a source is electrically connected to a bit line, and a drain is electrically connected to the capacitor. The word line voltage on the word line can control the on and off of the transistor, so that data information stored in the capacitor can be read through the bit line, data information can be written into the capacitor.

The DRAM relies on a power pump to supply power to the word lines. When the word lines in the DRAM are in the on state, due to the large load of a chip, a plurality of power pumps are usually required to supply power to the word lines; and when the word lines in the DRAM are in the off state, the load of the chip is relatively small, only one power pump is required to supply power to the word lines. Therefore, whether the power pump can work normally is very important to the transmission of word line signals in the DRAM. At present, the detection on the performance of the power pump has the disadvantages of low detection accuracy, long time consumption and laboriousness.

SUMMARY

The subject matter is described in detail herein below, which is not intended to limit the scope of protection of claims.

The present disclosure provides a chip detection method and a chip detection apparatus.

The first aspect of the present disclosure provides a chip detection method, including:

providing a chip to be tested, the chip including a power pump region, and the power pump region including a plurality of power pump structures;

detecting a dim light signal emitted from the power pump region when the chip is in a preset working mode; and determining whether the dim light signal matches a corresponding power pump working mode in the preset working mode, and if not, confirming that the power pump region has a defect, the power pump working mode including a working state of the power pump structures in the power pump region.

The second aspect of the present disclosure provides a chip detection apparatus, including:

a test module, configured to transmit a test signal to a chip to be tested so that the chip is in a preset working mode, the chip including a power pump region, and the power pump region including a plurality of power pump structures;

a detection module, configured to detect a dim light signal emitted from the power pump region when the chip is in the preset working mode; and a determination module, configured to determine whether the dim light signal matches a corresponding power pump working mode in the preset working mode, and if not, confirm that the power pump region has a defect, the power pump working mode including a working state of the power pump structures in the power pump region.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

At present, two methods are usually used to detect the performance of power pumps in a DRAM: the first method includes simulation verification and electrical speculation through theoretical circuit simulation; and the second method adopts PFA (Physical Failure Analysis) FIB (Focused Ion beam) technique, which uses a focused GA positive ion beam to bombard a passivation layer corresponding to a target signal of a chip, so that the metal layer configured to conduct the target signal is exposed, leading out a power pump detection wave signal, which is detected by an oscilloscope probe to determine the current state of the power pumps. Although the first method can quickly detect the working state of the power pumps, because many factors in the actual manufacturing process are not considered, there is a difference between theory and practice, and the accuracy of the detection result is low. Although the second method can determine the working state of the power pumps relatively accurately, it consumes too much manpower, material resources and time.

Figure 1:
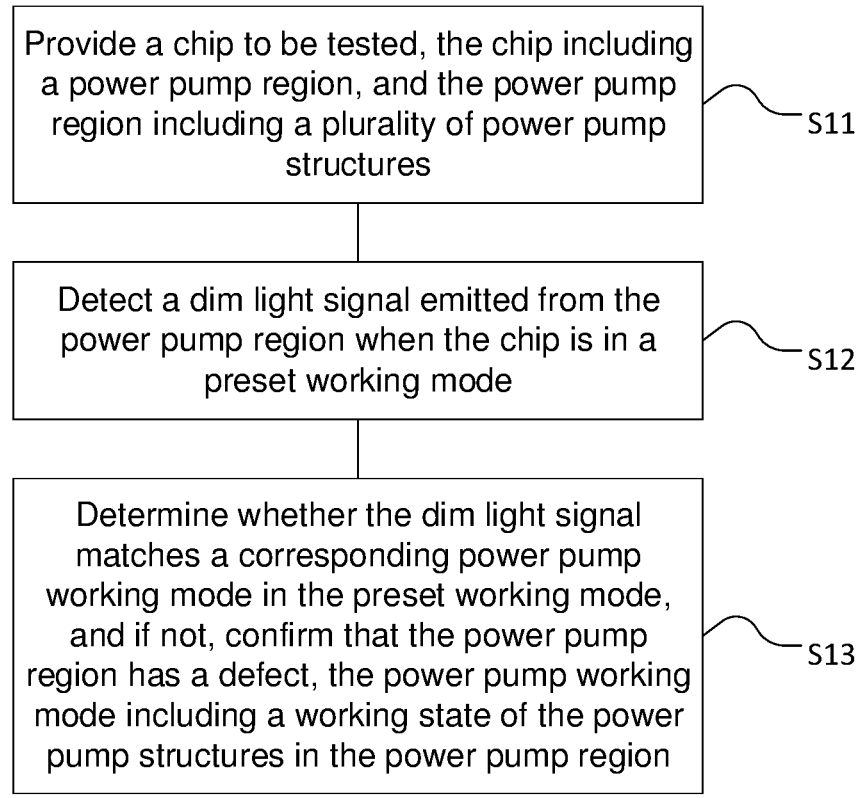
FIG. 1 is a flowchart of a chip detection method in an embodiment of the present disclosure.
Figure 2:
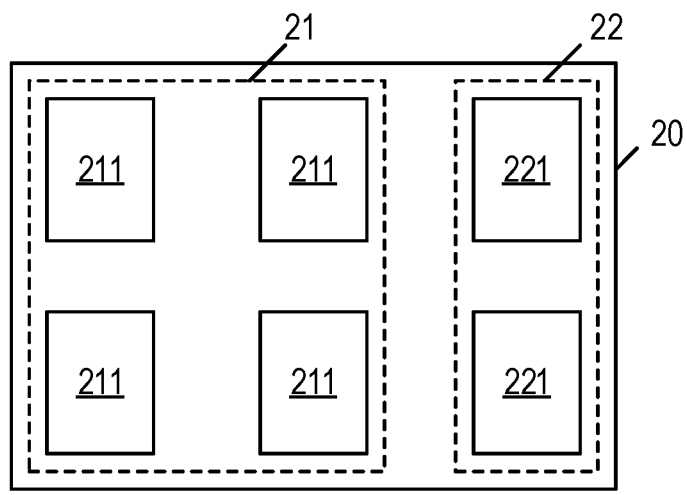
FIG. 2 is a schematic structure diagram of a power pump region in an embodiment of the present disclosure.
Figure 3:
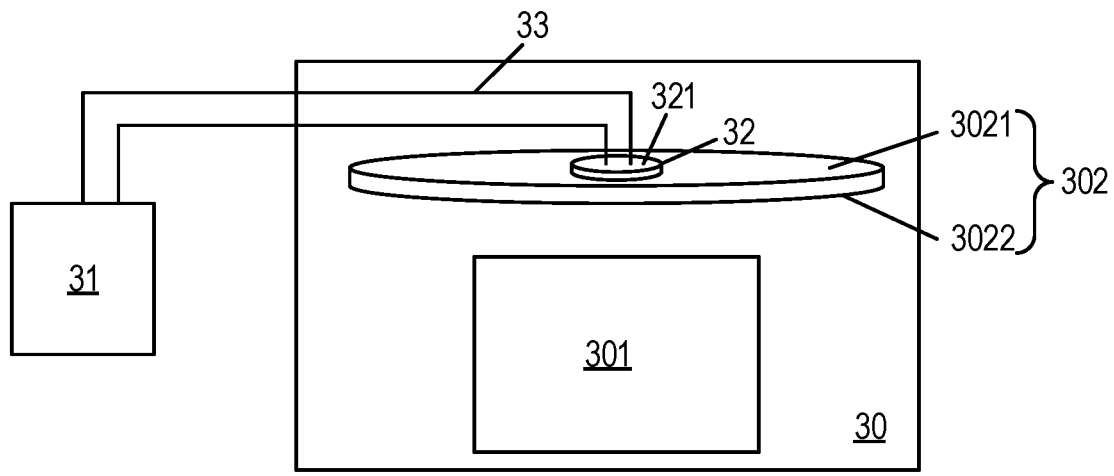
FIG. 3 is a diagram illustrating the relative positional relationship between a chip and a dim light lens when the chip is detected in an embodiment of the present disclosure.

An embodiment of the present disclosure provides a chip detection method. FIG. 1 is a flowchart of a chip detection method in an embodiment of the present disclosure, FIG. 2 is a schematic structure diagram of a power pump region in an embodiment of the present disclosure, and FIG. 3 is a diagram illustrating the relative positional relationship between a chip and a dim light lens when the chip is detected in an embodiment of the present disclosure. As shown in FIGS. 1 to 3, the chip detection method provided in the embodiment of the present disclosure includes:

Step S11, a chip 32 to be tested is provided, the chip 32 including a power pump region 20, and the power pump region 20 including a plurality of power pump structures.

The chip 32 may be a DRAM chip, or other chips powered by power pump structures. Taking the DRAM chip as an example, the chip includes a storage region and a power pump region 20 outside the storage region, the storage region has word lines for transmitting gate signals, and the power pump structures in the power pump region 20 are used to supply power to the word lines. The specific type of the power pump structures may be selected by those skilled in the art according to actual requirements. For example, the power pump structures are circuit structures including CMOS transistors, as long as they can emit dim light signals after being started.

Step S12, a dim light signal emitted from the power pump region 20 when the chip 32 is in a preset working mode is detected.

In this embodiment, a specific test signal is transmitted to the chip 32, so that the chip 32 is in the preset working mode, and a dim light detector is used to detect the dim light signal emitted from the power pump region 20 when the chip 32 is in the preset working mode. For example, during the design of the chip 32, in order to meet the requirements of subsequent performance test of the chip 32, a DFT (Design For Test) is set in the chip 32. The DFT includes a plurality of test modes, which are able to drive the chip 32 in different working modes later, so as to test multiple properties or multiple structures of the chip 32, for determining whether the chip 32 meets the design requirements or providing references for subsequent technical improvements on chips. As shown in FIG. 3, in this embodiment, the chip 32 may be placed in a detection equipment 30, and the chip 32 is electrically connected to a test equipment 31 outside the detection equipment 30 by a cable 33. The test equipment 31 transmits a test signal to the chip 32 to enable a specific test mode in the DFT, so that the chip 32 is in the preset working mode. The plurality in this embodiment refers to two or more.

Step S13, whether the dim light signal matches a corresponding power pump working mode in the preset working mode is determined, and if not, it is confirmed that the power pump region has a defect, the power pump working mode including a working state of the power pump structures in the power pump region 20.

The working state of the power pump structures in the power pump region 20 includes a working state of each power pump structure in the power pump region 20. The working state of the power pump structure includes an on state and an off state. The power pump structure emits a dim light signal of a specific wavelength when it is turned on, and does not emit any dim light signal when it is turned off. For example, a plurality of power pump working modes corresponding to a plurality of preset working modes one to one may be preset. Taking the chip 32 that is a DRAM chip as an example, the preset working mode includes a run working mode and a pre-charge working mode. In the run working mode, the word lines in the chip 32 are in an on state, the load of the chip 32 is relatively large, and the plurality of power pump structures in the power pump region 20 are required to supply power to the word lines. Therefore, the power pump working mode corresponding to the run working mode is activation of the plurality of power pump structures in the power pump region 20. In the pre-charge working mode, the word lines in the chip 32 are in an off state, the load of the chip 32 is relatively small, and only one power pump structure in the power pump region 20 is required to supply power to the word lines. Therefore, the power pump working mode corresponding to the pre-charge working mode is activation of one power pump structure in the power pump region 20. When the chip 32 is another type of chip, the preset working mode may be set according to the on and off states of signal lines in the chip 32.

In an exemplary embodiment, the detecting a dim light signal emitted from the power pump region 20 when the chip is in a preset working mode includes:

The chip 32 is placed with a front side up on a transparent stage 302, and a dim light detection lens 301 is placed toward a back side 3022 of the transparent stage 302;

The dim light signal emitted from the power pump region 20 when the chip 32 is in the preset working mode is detected from the back side of the chip 32.

In this embodiment, the chip 32 includes a front side 321 of the chip 32 and a back side of the chip 32 that are opposite, and the surface of the chip 32 facing the transparent stage 302 is the back side of the chip 32. The transparent stage 302 includes a front side 3021 of the transparent stage and a back side 3022 of the transparent stage that are opposite, and the surface of the transparent stage 302 facing the chip 32 is the front side 3021 of the transparent stage. In this embodiment, the front side 321 of the chip 32 may be placed with a front side up on the front side 3021 of the transparent stage 302 inside the detection equipment 30, and the dim light detection lens 301 for detecting dim light signals faces the back side 3022 of the transparent stage 302, so as to timely and accurately detect the dim light signal emitted from the power pump region 20 due to electric leakage. The dim light signal detected by the dim light detection lens 301 can intuitively reflect the position of dim light emitted in the power pump region 20 and the number of dim light signals appearing in the power pump region 20.

In an exemplary embodiment, the power pump structure includes a CMOS transistor;

The dim light detection lens 301 can detect dim light with a wavelength ranging from 700 nm to 1400 nm.

In an exemplary embodiment, the dim light detection lens 301 is an InGaAs lens.

When the CMOS transistor is working, a large number of electrons are recombined with holes, and the kinetic energy of the electrons is converted into light energy, thereby generating a dim light signal with a wavelength of about 1100 nm. The InGaAs lens includes a near infrared photodetector, which can capture dim light signals in the range of 700 nm to 1400 nm. Therefore, the dim light signal emitted by the activated power pump structure can be captured by the InGaAs lens.

In an exemplary embodiment, the preset working mode includes a run working mode; the detecting a dim light signal emitted from the power pump region 20 when the chip 32 is in a preset working mode includes:

A first test signal is transmitted from the test equipment 31 to the chip 32, so that the chip 32 is in the run working mode;

A first dim light signal 212 emitted from the power pump region 20 when the chip 32 is in the run working mode is detected.

In an exemplary embodiment, the power pump region includes a first sub-region 21, and the first sub-region 21 includes a plurality of active power pump structures 211; the determining whether the dim light signal matches a corresponding power pump working mode in the preset working mode includes:

Whether the first dim light signal 212 is emitted by the plurality of active power pump structures 211 in the first sub-region 21 together is determined, and if not, it is confirmed that the dim light signal does not match the corresponding power pump working mode in the preset working mode.

Figure 4:
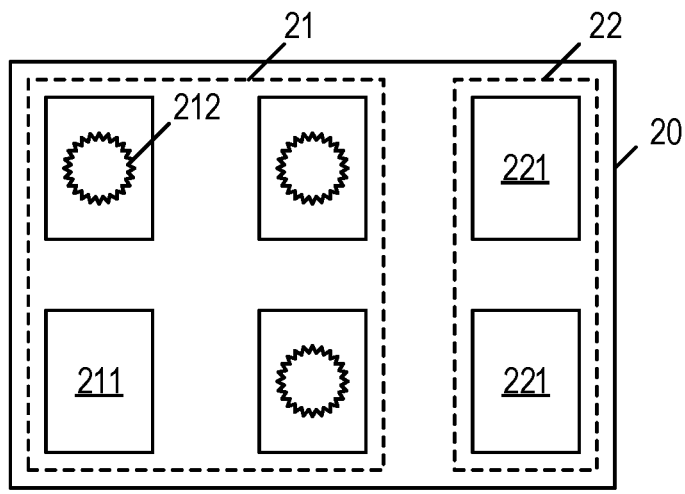
FIG. 4 is a schematic diagram of normal first dim light signals in the power pump region detected when the chip is in a run state in an embodiment of the present disclosure.

FIG. 4 is a schematic diagram of normal first dim light signals in the power pump region detected when the chip is in a run state in an embodiment of the present disclosure. For example, when the first test signal is transmitted to the chip 32 by the test equipment 31 outside the detection equipment 30 so that the chip 32 is in the run state, in order to meet the high load requirement of the chip 32, three active power pump structures 211 in the first sub-region 21 of the power pump region 20 need to be activated. At this time, if the first dim light signal 212 detected by the dim light detection lens 301 from the back side of the chip 32 is only located in the first sub-region 21, and the number of the first dim light signal 212 is three (as shown in FIG. 4), it is confirmed that the power pump structures in the power pump region 20 work normally when the chip 32 is in the run state. The number and positions of the active power pump structures 211 that should theoretically be activated in the power pump region 20 in the run state may be preset according to actual requirements. The specific type of the test equipment 31 may be selected by those skilled in the art according to actual requirements, as long as the test signal can be transmitted to the chip 32 so that the chip 32 is in the run state.

In an exemplary embodiment, the preset working mode includes a pre-charge working mode; the detecting a dim light signal emitted from the power pump region 20 when the chip 32 is in a preset working mode includes:

A second test signal is transmitted from the test equipment 31 to the chip 32, so that the chip 32 is in the pre-charge working mode;

A second dim light signal 222 emitted from the power pump region 20 when the chip 32 is in the pre-charge working mode is detected.

In an exemplary embodiment, the power pump region includes a second sub-region 22, and the second sub-region 22 includes a plurality of standby power pump structures 221; the determining whether the dim light signal matches a corresponding power pump working mode in the preset working mode includes:

Whether the second dim light signal 222 is emitted by only one standby power pump structure 221 in the second sub-region 22 is determined, and if not, it is confirmed that the dim light signal does not match the corresponding power pump working mode in the preset working mode.

Figure 5:
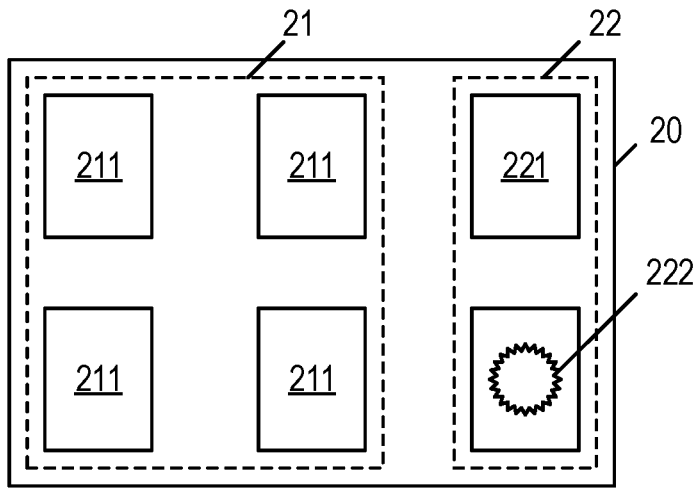
FIG. 5 is a schematic diagram of a normal second dim light signal in the power pump region detected when the chip is in a pre-charge state in an embodiment of the present disclosure.
Figure 6:
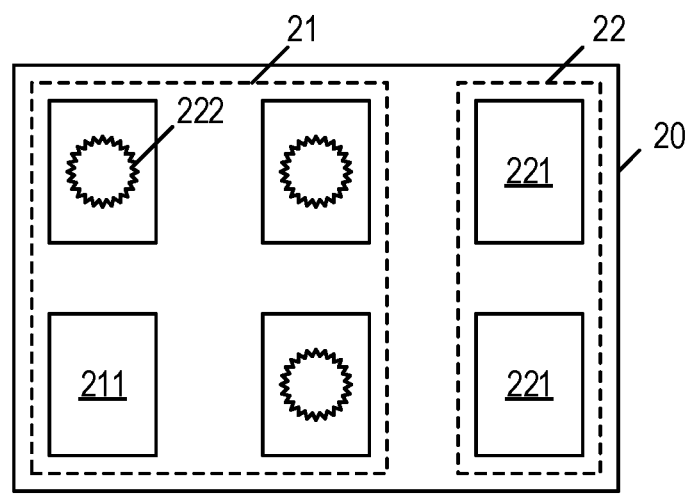
FIG. 6 is a schematic diagram of abnormal second dim light signals in the power pump region detected when the chip is in the pre-charge state in an embodiment of the present disclosure.

FIG. 5 is a schematic diagram of a normal second dim light signal in the power pump region detected when the chip is in the pre-charge state in an embodiment of the present disclosure, and FIG. 6 is a schematic diagram of abnormal second dim light signals in the power pump region detected when the chip is in the pre-charge state in an embodiment of the present disclosure. For example, when the second test signal is transmitted to the chip 32 by the test equipment 31 outside the detection equipment 30 so that the chip 32 is in the pre-charge state, since the load of the chip 32 is relatively low, only one standby power pump structure 221 in the second sub-region 22 of the power pump region 20 is activated. At this time, if the second dim light signal 222 detected by the dim light detection lens 301 is only located in the second sub-region 22, and the number of the second dim light signal 222 is only one (as shown in FIG. 5), it is confirmed that the power pump structures in the power pump region 20 work normally when the chip 32 is in the pre-charge state. When the second dim light signal 222 detected by the dim light detection lens 301 is located in the first sub-region 21 and/or the number of the second dim light signal 222 is greater than one (as shown in FIG. 6), it is confirmed that the power pump region 20 has a defect. The number and position of the standby power pump structure 221 that should theoretically be activated in the power pump region 20 in the pre-charge state may be preset according to actual requirements.

Those skilled in the art may transmit only the first test signal to the chip 32 through the test equipment 31 according to actual requirements, so as to detect whether the working status of the active power pump structures 211 in the first sub-region 21 is normal when the chip 32 is in the run state; or, transmit only the second test signal to the chip 32 through the test equipment 31, so as to detect whether the working status of the standby power pump structures 211 in the second sub-region 22 is normal when the chip 32 is in the pre-charge state. Those skilled in the art may also successively verify whether the working status of the power pump region 20 is normal when the chip 32 is in the run state and the pre-charge state according to actual requirements, so as to achieve comprehensive detection on the performance of the power pump region 20. For example, the first test signal may be transmitted to the chip 32 through the test equipment 31 first, and after it is verified that the working status of the active power pump structures 211 in the first sub-region 21 is normal when the chip 32 is in the run state, the second test signal is transmitted to the chip 32 through the test equipment 31, to verify whether the working status of the standby power pump structures 211 in the second sub-region 22 is normal when the chip 32 is in the pre-charge state.

Figure 7:
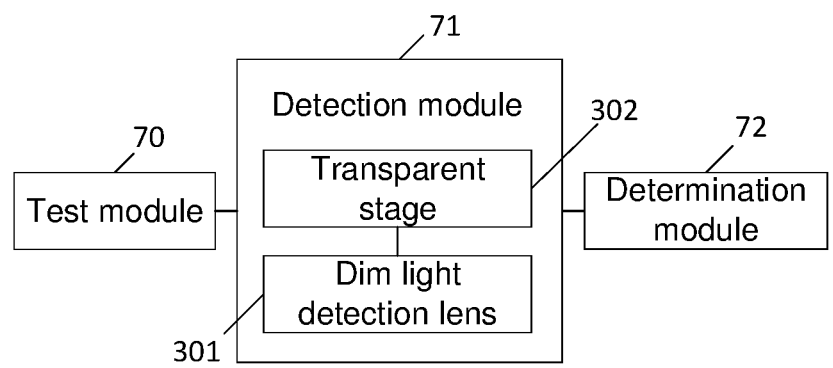
FIG. 7 is a schematic structure diagram of a chip detection apparatus in an embodiment of the present disclosure.

In addition, this embodiment further provides a chip detection apparatus. FIG. 7 is a schematic structure diagram of a chip detection apparatus in an embodiment of the present disclosure. The chip detection apparatus provided in this embodiment may use the chip detection method shown in FIGS. 1 to 6 to detect a chip. As shown in FIGS. 1 to 7, the chip detection apparatus provided in this embodiment includes:

a test module 70, configured to transmit a test signal to a chip 32 to be tested so that the chip 32 is in a preset working mode, the chip 32 including a power pump region 20, and the power pump region 20 including a plurality of power pump structures;

a detection module 71, configured to detect a dim light signal emitted from the power pump region 20 when the chip 32 is in the preset working mode; and a determination module 72, configured to determine whether the dim light signal matches a corresponding power pump working mode in the preset working mode, and if not, confirm that the power pump region 20 has a defect, the power pump working mode including a working state of the power pump structures in the power pump region 20.

In an exemplary embodiment, the detection module 71 includes a transparent stage 302 and a dim light detection lens 301, and the chip 32 is placed with a front side up on the transparent stage 302; the dim light detection lens 301 is placed toward a back side of the transparent stage 302, so that the dim light detection lens 301 can detect, from the back side of the chip 32, the dim light signal emitted from the power pump region 20 when the chip 32 is in the preset working mode.

In an exemplary embodiment, the power pump structure includes a CMOS transistor;

The dim light detection lens 301 can detect dim light with a wavelength ranging from 700 nm to 1400 nm.

In an exemplary embodiment, the dim light detection lens 301 is an InGaAs lens.

In an exemplary embodiment, the preset working mode includes a run working mode;

The test module 70 is configured to transmit a first test signal to the chip 32, so that the chip 32 is in the run working mode;

The detection module 71 is configured to detect a first dim light signal emitted from the power pump region 20 when the chip 32 is in the run working mode.

In an exemplary embodiment, the power pump region 20 includes a first sub-region 21, and the first sub-region 21 includes a plurality of active power pump structures 211;

The determination module 72 is configured to determine whether the first dim light signal 212 is emitted by the plurality of active power pump structures 211 in the first sub-region 21 together, and if not, confirm that the dim light signal does not match the corresponding power pump working mode in the preset working mode.

In an exemplary embodiment, the preset working mode includes a pre-charge working mode;

The test module 70 is configured to transmit a second test signal to the chip 32, so that the chip 32 is in the pre-charge working mode;

The detection module 71 is configured to detect a second dim light signal emitted from the power pump region 20 when the chip 32 is in the pre-charge working mode.

In an exemplary embodiment, the power pump region 20 includes a second sub-region 22, and the second sub-region 22 includes a plurality of standby power pump structures 221;

The determination module 72 is configured to determine whether the second dim light signal is emitted by only one standby power pump structure 221 in the second sub-region 22, and if not, confirm that the dim light signal does not match the corresponding power pump working mode in the preset working mode.

In the chip detection method and the chip detection apparatus provided in this embodiment, the chip is driven to be in a specific working mode, the dim light signal of the power pump region in the specific working mode of the chip is detected by means of dim light detection, and whether the working mode of the chip matches the working mode of power pumps is determined through the dim light signal to determine whether the power pump region has a defect, so the detection process is easy to operate, and the dim light signal can quickly and intuitively reflect the working state of the power pump structures in the power pump region, which saves the detection cost and can greatly improve the accuracy of detection.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It may be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the chip detection method and the chip detection apparatus provided by the embodiments of the present disclosure, the chip is driven to be in a specific working mode, the dim light signal of the power pump region in the specific working mode of the chip is detected by means of dim light detection, and whether the working mode of the chip matches the working mode of power pumps is determined through the dim light signal to determine whether the power pump region has a defect, so the detection process is easy to operate, and the dim light signal can quickly and intuitively reflect the working state of the power pump structures in the power pump region, which saves the detection cost and can greatly improve the accuracy of detection.

The invention claimed is:

1. A chip detection method, comprising:
providing a chip to be tested, the chip comprising a power pump region, and the power pump region comprising a plurality of power pump structures;
detecting a dim light signal emitted from the power pump region when the chip is in a preset working mode; and
determining whether the dim light signal matches a corresponding power pump working mode in the preset working mode, and when not, confirming that the power pump region has a defect, the power pump working mode comprising a working state of the power pump structures in the power pump region;
wherein the preset working mode comprises a pre-charge working mode; and the detecting a dim light signal emitted from the power pump region when the chip is in a preset working mode comprises:
transmitting a second test signal from a test equipment to the chip, so that the chip is in the pre-charge working mode; and
detecting a second dim light signal emitted from the power pump region when the chip is in the pre-charge working mode.

2. The chip detection method according to claim 1, wherein the detecting a dim light signal emitted from the power pump region when the chip is in a preset working mode comprises:
placing the chip with a front side up on a transparent stage, and placing a dim light detection lens toward a back side of the transparent stage; and
detecting, from a back side of the chip, the dim light signal emitted from the power pump region when the chip is in the preset working mode.

3. The chip detection method according to claim 2, wherein the power pump structure comprises a complementary metal oxide semiconductor (CMOS) transistor; and
the dim light detection lens is configured to detect dim light with a wavelength ranging from 700 nm to 1400 nm.

4. The chip detection method according to claim 3, wherein the dim light detection lens is an InGaAs lens.

5. The chip detection method according to claim 1, wherein the preset working mode comprises a run working mode; and the detecting a dim light signal emitted from the power pump region when the chip is in a preset working mode comprises:

transmitting a first test signal from the test equipment to the chip, so that the chip is in the run working mode; and
detecting a first dim light signal emitted from the power pump region when the chip is in the run working mode.

6. The chip detection method according to claim 5, wherein the power pump region comprises a first sub-region, and the first sub-region comprises a plurality of active power pump structures; and the determining whether the dim light signal matches a corresponding power pump working mode in the preset working mode comprises:
determining whether the first dim light signal is emitted by the plurality of active power pump structures in the first sub-region together, and when not, confirming that the dim light signal does not match the corresponding power pump working mode in the preset working mode.

7. The chip detection method according to claim 1, wherein the power pump region comprises a second sub-region, and the second sub-region comprises a plurality of standby power pump structures; and the determining whether the dim light signal matches a corresponding power pump working mode in the preset working mode comprises:
determining whether the second dim light signal is emitted by only one standby power pump structure in the second sub-region, and when not, confirming that the dim light signal does not match the corresponding power pump working mode in the preset working mode.

8. A chip detection apparatus, comprising:
a test module, configured to transmit a test signal to a chip to be tested so that the chip is in a preset working mode, the chip comprising a power pump region, and the power pump region comprising a plurality of power pump structures;
a detection module, configured to detect a dim light signal emitted from the power pump region when the chip is in the preset working mode; and
a determination module, configured to determine whether the dim light signal matches a corresponding power pump working mode in the preset working mode, and when not, confirm that the power pump region has a defect, the power pump working mode comprising a working state of the power pump structures in the power pump region;
wherein the preset working mode comprises a pre-charge working mode;
the test module is configured to transmit a second test signal to the chip, so that the chip is in the pre-charge working mode; and
the detection module is configured to detect a second dim light signal emitted from the power pump region when the chip is in the pre-charge working mode.

9. The chip detection apparatus according to claim 8, wherein the detection module comprises a transparent stage and a dim light detection lens, and the chip is placed with a front side up on the transparent stage; and the dim light detection lens is placed toward a back side of the transparent stage, so that the dim light detection lens is configured to detect, from a back side of the chip, the dim light signal emitted from the power pump region when the chip is in the preset working mode.

10. The chip detection apparatus according to claim 9, wherein the power pump structure comprises a complementary metal oxide semiconductor (CMOS) transistor; and the dim light detection lens is configured to detect dim light with a wavelength ranging from 700 nm to 1400 nm.

11. The chip detection apparatus according to claim 10, wherein the dim light detection lens is an InGaAs lens.

12. The chip detection apparatus according to claim 8, wherein the preset working mode comprises a run working mode;
the test module is configured to transmit a first test signal to the chip, so that the chip is in the run working mode; and
the detection module is configured to detect a first dim light signal emitted from the power pump region when the chip is in the run working mode.

13. The chip detection apparatus according to claim 12, wherein the power pump region comprises a first sub-region, and the first sub-region comprises a plurality of active power pump structures; and
the determination module is configured to determine whether the first dim light signal is emitted by the plurality of active power pump structures in the first sub-region together, and when not, confirm that the dim light signal does not match the corresponding power pump working mode in the preset working mode.

14. The chip detection apparatus according to claim 8, wherein the power pump region comprises a second sub-region, and the second sub-region comprises a plurality of standby power pump structures; and
the determination module is configured to determine whether the second dim light signal is emitted by only one standby power pump structure in the second sub-region, and when not, confirm that the dim light signal does not match the corresponding power pump working mode in the preset working mode.

15. A chip detection method, comprising:
providing a chip to be tested, the chip comprising a power pump region, and the power pump region comprising a plurality of power pump structures;
detecting a dim light signal emitted from the power pump region when the chip is in a preset working mode; and
determining whether the dim light signal matches a corresponding power pump working mode in the preset working mode, and when not, confirming that the power pump region has a defect, the power pump working mode comprising a working state of the power pump structures in the power pump region;
wherein the preset working mode comprises a run working mode; and the detecting a dim light signal emitted from the power pump region when the chip is in a preset working mode comprises:
transmitting a first test signal from a test equipment to the chip, so that the chip is in the run working mode; and
detecting a first dim light signal emitted from the power pump region when the chip is in the run working mode;
wherein the power pump region comprises a first sub-region, and the first sub-region comprises a plurality of active power pump structures; and the determining whether the dim light signal matches a corresponding power pump working mode in the preset working mode comprises:
determining whether the first dim light signal is emitted by the plurality of active power pump structures in the first sub-region together, and when not, confirming that the dim light signal does not match the corresponding power pump working mode in the preset working mode.

* * * * *